United States Patent [19]

Spence

[11] 4,044,335

[45] Aug. 23, 1977

[54] MEMORY CELL OUTPUT DRIVER

[75] Inventor: John R. Spence, Villa Park, Calif.

[73] Assignee: Rockwell International Corporation, El Segundo, Calif.

[21] Appl. No.: 713,029

[22] Filed: Aug. 9, 1976

Related U.S. Application Data

[63] Continuation of Ser. No. 508,297, Sept. 23, 1974, abandoned.

[51] Int. Cl.$^2$ ............................ G06F 3/00; G06F 5/04
[52] U.S. Cl. .................................................... 364/900
[58] Field of Search ........................ 340/172.5, 173 R; 445/1

[56] References Cited

U.S. PATENT DOCUMENTS

| | | | |
|---|---|---|---|
| 3,090,943 | 5/1963 | Lewis | 340/172.5 |
| 3,193,802 | 7/1965 | Deerfield | 340/172.5 |
| 3,374,467 | 3/1968 | Cast et al. | 340/172.5 |
| 3,417,377 | 12/1968 | Vietor et al. | 340/172.5 |
| 3,465,295 | 9/1969 | Witt et al. | 340/172.5 |
| 3,473,160 | 10/1969 | Wahlstrom | 340/172.5 |
| 3,742,456 | 6/1973 | McFiggens et al. | 340/172.5 |
| 3,763,480 | 10/1973 | Weimer | 340/173 R |

OTHER PUBLICATIONS

7080–Data Processing System Reference Manual, A-2-2-6560-1, 1962, pp. 2-7.
7621–Tape Control Unit Reference Manual, R23-9671, 1962, pp. 27-28.

Primary Examiner—Harvey E. Springborn
Attorney, Agent, or Firm—H. Fredrick Hamann; G. Donald Weber, Jr.; Morland Charles Fischer

[57] ABSTRACT

A buffered serial to parallel memory system uses an output driver which is semi-independently operated by separate control logic. Following conventional serial data input to a first buffer, the separate control logic responds to a predetermined signal to independently clear a second buffer, transfer the data from the first buffer to the second buffer and then clear the first buffer for further data input. The stored data in the second buffer is then used for output devices requiring parallel data output.

7 Claims, 2 Drawing Figures

MEMORY CELL OUTPUT DRIVER

This is a continuation, of application Ser. No. 508,297 filed Sept. 23, 1974 now abandoned.

BACKGROUND

1. Field of the Invention

This invention relates to a memory cell driver and, in particular, a memory cell and driver circuit using semiconductor devices.

2. Cross References-Prior Art

There are many known memory cells including several which utilize integrated circuit techniques. Typical memory cells are shown and described in U.S. Pat. Nos. 3,581,292 to Polkinghorn; 3,576,571 to Booher and 3,744,037 to Spence. However, most of the existing or known memory cell devices and associated drivers are utilized with a portion of an integrated circuit, per se. These circuits generally operate in a serial fashion, i.e. output signals are generated on appropriate addressing of the individual cells. The instant circuit, however, is directed to a memory cell device which has driver and output buffering. Thus, information generated by a suitable source such as calculator circuitry (e.g. a one chip calculator) can be utilized to drive a suitable printer device. The printer devices which can be driven include thermal print heads, solenoid driven hammer type printers or the like.

In one application, the memory cell driver with buffering is used to control the operation of a drum printer. Typical drum printers utilize one or more rotating wheels on the surfaces of which are embossed all of the alpha-numeric characters which may be printed. A separate column of characters is required for each character to be printed. The separate columns may be on a single drum or represented by a plurality of individual wheels which rotate together. The particular character which is printed is a function of the wheel position relative to time. This relationship is determined by the calculator circuitry whereby, during a particular time period, a print command is generated. The print command actuates suitable solenoids or the like wherein hammer action occurs such that a recording medium (e.g. paper) is pressed against the rotating character medium (e.g. drum or wheel) whereby the selected character is printed.

The circuit which is described herein is an interface circuit between the utilization device (i.e. printer) and the overall system (e.g. calculator chip). This interface system which includes a memory cell, drivers, and buffering output circuits, permits a single calculator chip to control a desirable utilization device.

-SUMMARY OF THE INVENTION

The memory output driver of the present invention permits the use of an output device, such as a printer, to be used with an information source with limited output capabilities, such as a single chip calculator. Such a device conventionally provides only serially strobed output information while the printer requires parallel data input. As the single chip calculator normally has no control signals capable of making the serial-to-parallel conversion, the memory output driver of the present invention includes a first control for effecting serial data input into a first memory portion and a second control means responsive to a single load-complete signal to clear a second memory portion, effect parallel transfer of the data to the second portion and thereafter clearing the first data for further data entry. The data in the second memory portion is available in parallel for further use.

The memory cells of the memory system are of the volatile, recirculating type and include generation circuitry for periodically boosting the information type stored therein.

BRIEF DESCRIPTION OF THE PREFERRED EMBODIMENT

Figure 1:
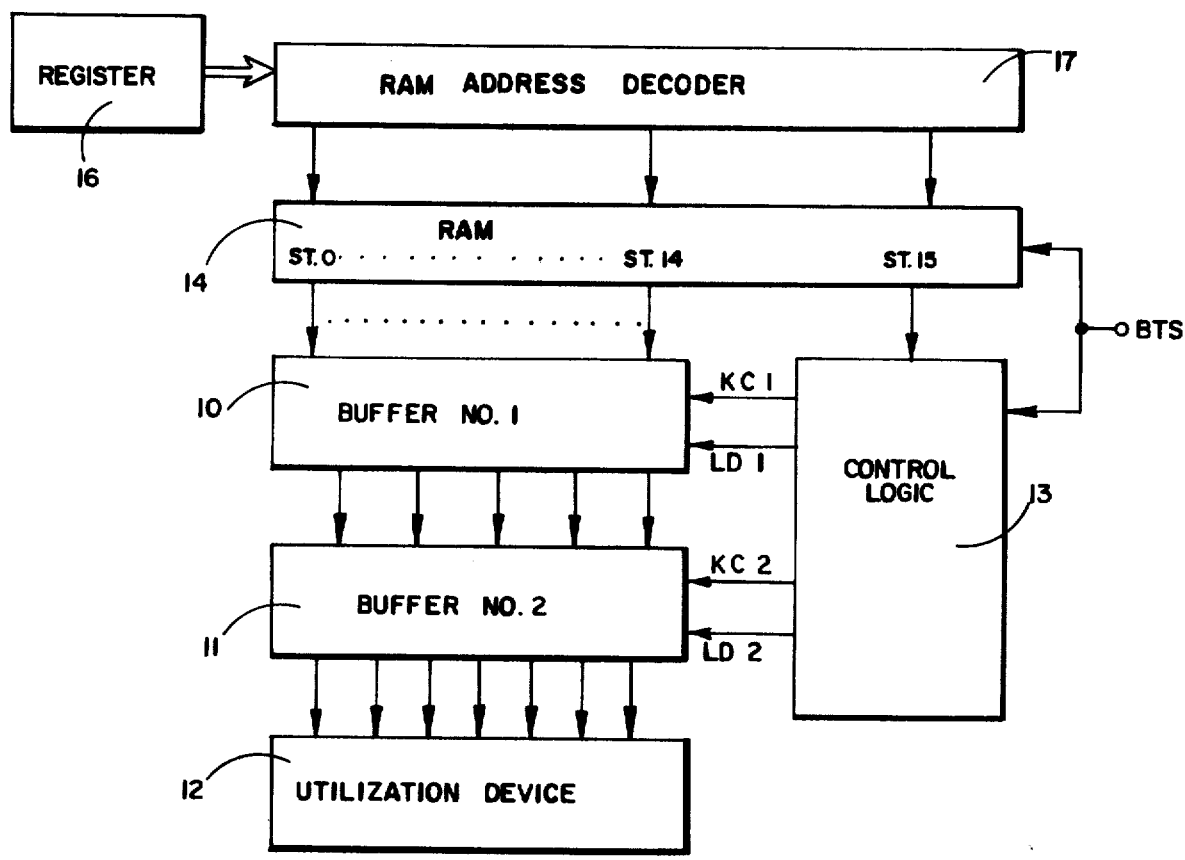
FIG. 1 shows a block diagram of a presently preferred embodiment of the invention.

Referring now to FIG. 1, there is shown a block diagram of a presently preferred embodiment of the invention. In this embodiment, a conventional random access memory (RAM) 14 is connected to supply output or strobe signals ST0 through ST14 to Buffer No. 1, hereinafter referred to as buffer 10. Another output terminal of RAM 14 is connected to supply output signal ST15 to an input terminal of control logic 13.

It should be noted that a RAM device is not required, per se. That is, other signal supplying means can be utilized. However, many suitable circuit applications include RAM devices. Therefore, this circuit embodiment reflects the use of a RAM as a suitable arrangement.

In typical applications, a RAM address decoder is included in the RAM device, per se. Such a decoder 17 is shown separately for convenience only, although a separate decoder can be used. Register 16, which may be any suitable signal supplying source is connected to decoder 17. In one embodiment, register 16 may comprise a plurality of flip flops arranged as a counter or the like.

As register 16 supplies coded signals to decoder 17, the individual strobe signals ST0-ST15 are sequentially produced. These strobe signals are supplied to the remainder of the circuit as described. The address lines, rather than the actual contents of the RAM, are utilized at the particular time that the strobe signals are supplied to buffer No. 1. At other times, these same strobe signals are used as RAM address signals for accessing RAM information. Thus, the address decoder does not have to be duplicated in order to feed Buffer No. 1 from RAM 14.

A plurality of output terminals of buffer 10 are connected to a like plurality of input terminals of Buffer No. 2 and Driver device hereinafter referred to as buffer 11. Similarly, a plurality of output terminals of buffer 11 are connected to a plurality of input terminals of utilization device 12. Clear (i.e. kill) and load signals are supplied by control logic 13 to buffer 10 and buffer 11, respectively. A control signal identified as BTS is applied to control logic 13 by external circuitry such as a calculator circuit, which is associated with RAM function of RAM 14. For an example of a patent showing a RAM to supply strobe signals to thereby enable the appropriate BTS control signal to be generated, reference may be made to U.S. Pat. No. 3,798,616, issued Mar. 19, 1974.

Typically, utilization device 12 may be a printer or the like which is driven by a plurality of input signals which are applied thereto in parallel. The signals are supplied by buffer 11. In a preferred embodiment, it is assumed that utilization device 12 includes means for applying a control signal wherein the signals from buffer 11 are applied (transferred) to utilization device 12 to effect actuation thereof. Of course, an additional control or command signal may be supplied in buffer 11 or via another interface circuit not shown.

Typically, buffer 11 is the memory and the output driver which supplies signals to utilization device 12. Buffer 11 thus holds output data during the time that buffer 10 is being loaded with new data under control of RAM 14. Buffer 10 comprises one or more memory cells each of which is loaded, one at a time, when selected by the RAM address lines. In the embodiment shown, the RAM address lines ST0-ST14 will, thus, sequentially apply fourteen signals to fourteen separate memory cells in buffer 10. Of course, the number of cells or RAM address lines is a function of the parallel output information which is required by utilization device 12 for operation.

The loading of buffer 10 from RAM 14 is a function of a control signal BTS which is applied by an external circuit not shown. The BTS instruction signal causes RAM 14 to and sequentially apply each of the signals at terminals ST0-ST14 to buffer 10. This operation causes information to be loaded into all of the memory cells in buffer 10. The next BTS signal (i.e. after all memory cells are loaded) causes output signal ST15 to be generated. This latter signal (load-complete signal) indicates the completion of the serial data input and is supplied to separate control logic 13 which essentially enables control logic 13 to transfer, in parallel, the information from buffer 10 to buffer 11 when another BTS signal is applied. Once signal ST15 is generated by RAM 14, a further BTS instruction signal is generated by the external circuitry not shown. When this additional signal occurs, control logic 13 produces the clear signal (KC 2) which effectively clears buffer 11 wherein each stage is set to a predetermined condition, for example zero. Thereafter, a load signal (LD 2) is generated by control logic 13 which causes buffer 11 to be loaded by means of tranferring, in parallel, all of the data from buffer 10 to buffer 11. Subsequently, a further clear signal (KC 1) is produced by control logic 13 wherein all of the cells in buffer 10 are set to a predetermined condition, for example zero. Buffer 10 is now ready for a new set of data instructions which will be supplied from RAM 14 via the RAM address lines.

After the application of load signal LD 2 (by which data is transferred from buffer 10 to buffer 11) a suitable command signal is generated by control logic 13 (or the external circuitry discussed supra) wherein utilization device 12 performs the action dictated by the data supplied thereto from buffer 11. Of course, in some instances, the clear signal KC 1 could effectively operate as the command signal if connected to utilization device 12 by a suitable circuitry.

The operation of the system shown in FIG. 1 continues with the application of additional BTS signals. That is, a further BTS signal, after operation of RAM 14 to generate the signal at address line ST15, is operable to recycle or re-sequence the operation of RAM 14 whereby the ST0 signal and so forth are generated sequentially.

Figure 2:
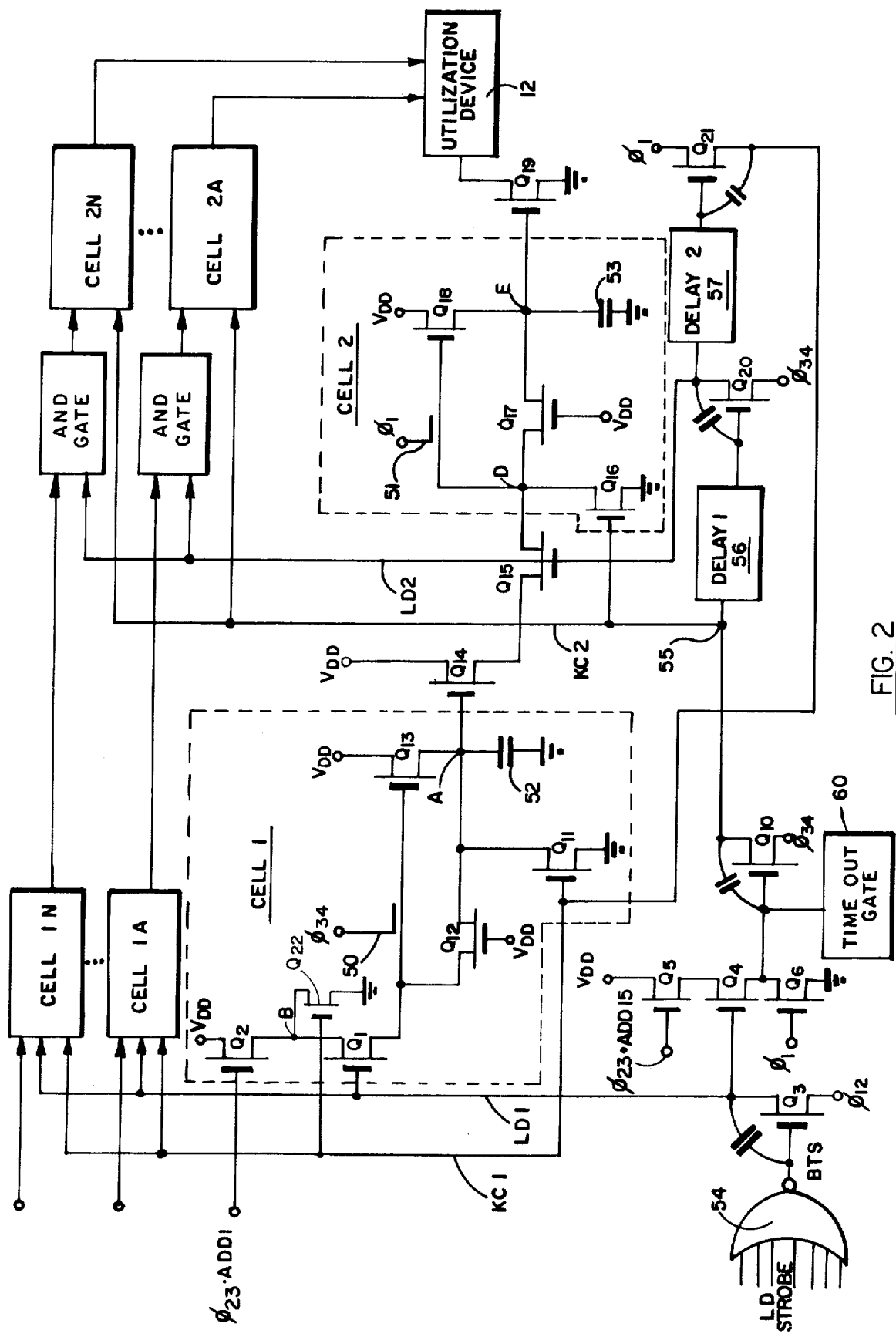
FIG. 2 is an expanded block and schematic diagram of the preferred embodiment of the instant invention shown in FIG. 1.

Referring now to FIG. 2, there is shown a detailed schematic diagram of the circuit utilized in the system shown in FIG. 1. In particular, a plurality of memory cells identified as cell 1 through cell 1N represent buffer 10. Likewise, a plurality of memory cells identified as cell 2 through cell 2N represent buffer 11. Each of the memory cells in buffer 10 includes interconnections through which an address signal from RAM 14 is applied to each of cells 1. Suitable interconnects are also provided whereby information is transferred from each of cells 1 to the associated cell 2.

In particular, cell 1 includes a pair of semiconductive devices Q1 and Q2 which have the conduction paths thereof connected in series. Although shown as field effect transistors (FET), other suitable devices may be utilized. Furthermore, for purposes of explanation, the FET's, as shown, are all considered to be of a similar type such as P-MOS, or N-MOS. The particular type of device is not critical to the invention per se. In fact, it is possible to utilize the CMOS techniques to produce the instant invention. However, modifications to the specific logic would be required in that situation.

One terminal of the conduction path of input transistor Q2 is connected to a suitable voltage source, for example $V_{DD}$. The other terminal of the conduction path of transistor Q2 is connected to one terminal of the conduction path of transistor Q1 at common junction B. The control electrode of transistor Q2 is connected to one of the address lines from the RAM while the control electrode of transistor Q1 is connected to receive the enabling signal as described hereinafter. Another terminal of the conduction path of transistor Q1 is connected in common to one terminal of the conduction path of transistor Q12 and to one plate of SMOC device 50. SMOC devices are generally shown and described in U.S. Pat. No. 3,591,836 to Booher et al, and entitled "Field Effect Conditionally Switched Capacitor". The other plate of SMOC device 50 is connected to a source of potential (e.g. $V_{DD}$ which is controlled by a clock source wherein SMOC device 50 is energized only during the third and fourth phases ($\phi 34$) of a conventionally generated four phase clock signal (generator not shown) labeled herein as the four sequential clock signals ($\phi_1$, $\phi_2$, $\phi_3$ and $\phi_4$) and combinations thereof, e.g. both phase three and phase four ($\phi_{34}$).

The control electrode of transistor Q12 is connected to voltage source $V_{DD}$. The other terminal of the conduction path of transistor Q12 is connected to common junction A which includes one plate of capacitor 52. Also connected to common junction A is one terminal of the conduction path of transistor Q13. The other terminal of the conduction path of transistor 13 is connected to source $V_{DD}$. The control electrode of transistor Q13 is connected to the first mentioned plate of SMOC device 50.

Transistor Q11 has the conduction path thereof connected between junction A and a suitable reference potential, for example ground. The control electrode of transistor Q11 is connected to "Kill Cell 1" (KC1) line described hereinafter. The control electrode of transistor Q22 is connected to KC1 line as well. Common junction B between the conduction paths of transistors Q2 and Q1 is connected to a suitable reference potential, for example ground, via the conduction path of transistor Q22.

Inasmuch as the operation of cell 1 as a volatile recirculating memory cell is conventional and described in the prior art, e.g., see the patents noted above, only a brief description thereof is presented herewith. Initially, it is assumed that memory cell 1 is set to a zero condition. This is achieved by applying a signal on the KC1 line wherein transistors Q22 and Q11 are rendered operative so that nodes A and B are shorted to ground.

If now, information is to be inserted into cell 1, it is essential that an enabling signal (LD1) be applied to the control electrode of transistor Q1 (as described hereinafter) concurrently (i.e. such as, for example, during application of the $\phi_2$ clock signal when both FETs $Q_1$ and $Q_2$ are enabled) with the application of the sequentially selected data signal end properly phased clock signal $\phi_{23}$. ADD1 to the control electrode of transistor Q2. The selected data signal controls the kind of information (i.e. binary 1 or 0) inserted into the cell. If a binary 1 is to be entered, both of these transistors are enabled. Thus, $V_{DD}$ is supplied by the conduction paths of transistors Q2 and Q1 to the control electrode of transistor Q13. This operation causes the signal $V_{DD}$ (less one threshold voltage $V_t$) to be applied to node A. Inasmuch as the KC1 signal has been terminated, transistors Q22 and Q11 are nonconductive and do not clamp nodes A and B to ground. Therefore, the signal ($V_{DD}$-$V_t$) at node A is stored on capacitor 52. The signal at node A is selectively refreshed by application of the phased clock signal $\phi$34 by SMOC device 50. That is, when SMOC device 50 is energized by the application of the signal $\phi$34, transistor Q13 is rendered conductive and the signal $V_{DD}$ is reapplied at node A. This signal is recirculated through transistor Q12 (which is always conductive due to the application of signal $V_{DD}$ at the control electrode thereof) and by SMOC device 50 (which is operative during time $\phi$34) wherein the signal at node A is refreshed, reinforced and stored.

Of course, if the signal to be stored in cell 1 is a zero, the signal at the control electrode of transistor Q1 maintains this transistor in the off condition whereby application of the address signal to the control electrode of transistor Q2 has had no effect. That is, with transistor Q1 nonconductive, there is no circuit path for signal $V_{DD}$ to be supplied beyond node B. Consequently, a binary zero is written into the circuit inasmuch as transistor Q13 is not conductive and node A remains at the binary zero potential. This potential is recirculated through transistor Q12 and SMOC device 50.

Node A is also connected to the control electrode of transistor Q14. The conduction path of transistor Q14 is connected in series with the conduction path of transistor Q15 between source $V_{DD}$ and node D. The control electrode of transistor Q15 is connected to the "Load Cell 2" (LD2) line as described hereinafter. The other terminal of the conduction path of transistor Q15 is connected to node D which is connected to one plate of SMOC device 51 and one terminal of the conduction path of transistor Q17. The other terminal of the conduction path of transistor Q17 is connected to node E which is connected to one terminal of capacitor 53 and to one terminal of the conduction path of transistor Q18. The other terminal of capacitor 53 is connected to suitable reference potential, for example ground. The other terminal of transistor Q18 is connected to source $V_{DD}$. The control electrode of transistor Q18 is connected to the first mentioned plate of SMOC device 51. The other plate of SMOC device 51 is connected to a source of potential (i.e. $V_{DD}$) which is supplied during the $\phi$1 phase of the four phase clock cycle. The control electrode of transistor Q17 is connected to source $V_{DD}$. The conduction path of transistor Q16 is connected between node D and a suitable reference potential, for example ground. The control electrode of transistor Q16 is connected to "Kill Cell 2" (KC2) line described hereinafter.

Cell 2 operates in a manner similar to cell 1. Transistors Q14 and Q15 perform an interface function and control the information supplied to cell 2 at node D from cell 1. The information stored in cell 1 at node A controls the status of interface transistor Q14. Interface transistor Q15 is controlled and enabled by transistor Q20 as described hereinafter. The interface function is therefore essentially an enabled AND operation as illustrated by the AND gates controlling the input to cells 2A-2H. The signal at node D is applied to node E via transistor Q17. Recirculating and refreshing memory operation is established through SMOC device 51 and transistor Q18 as described supra at clock phase $\phi_1$. In the absence of further data input to cell 1, the data signal at node E will be indefinitely maintained.

Node E is connected to the control electrode of transistor Q19. The conduction path of transistor Q19 is connected between utilization device 12 and a suitable reference potential, for example ground. Effectively, transistor Q19 operates as a driver network. That is, when the signal at node E is a binary one, transistor Q19 is rendered operative to connect utilization device 12 to ground thereby energizing same. Conversely, when the signal at node E is a binary zero, transistor Q19 is rendered nonconductive wherein utilization device 12 is not connected to ground and remains inoperative. Of course, this logic condition can be reversed by those skilled in the art.

Transistor Q16 selectively shorts node D to ground thereby clearing cell 2 as described hereinafter. When node D is shorted to ground, cell 2 is essentially cleared to an initial condition.

Control logic 13 (of FIG. 1) includes NOR gate 54 which receives a plurality of input (Load Strobe) signals from control circuitry (not shown) such as a calculator chip or the like. The BTS signal is produced as a function of the signals applied to gate 54. The BTS signal is applied to the control electrode of transistor Q3. One terminal of the conduction path of transistor Q3 is connected to a source which supplies a signal during the $\phi$12 phase of a four phase clock. The other terminal of the conduction path of transistor Q3 is connected to the control electrode of transistor Q1 (and each of the counterpart transistors in cells 1A through 1N) and to the control electrode of transistor Q4. The conduction path of transistor Q4 is connected in series with the conduction paths of transistors Q5 and Q6. One terminal of the conduction path of transistor Q6 is connected to a suitable reference potential, for example ground. The other terminal of the conduction path of transistor Q5 is connected to a suitable reference potential, for example $V_{DD}$. The control electrode of transistor Q6 is connected to receive the signal $\phi$1 from the four phase clock signal source. Simlary, the control electrode of transistor Q5 is connected to receive the signal $\phi$23. ADD15 from the RAM. This signal is clock signal $\phi$23 in conjunction with the address 15 or ST15 signal from RAM 14 as shown in FIG. 1 which, as described above, indicates that all the memory cells comprising buffer 10 (of FIG. 1) have been loaded.

In essence, the BTS signal is operative to render transistor Q3 conductive. An enabling signal is applied to the control electrodes of transistors Q1 and Q2 via the conduction path of transistor Q3 only during on cycles of $\phi$12 whereby transistors Q1 (in all of cells 1) are enabled during phase $\phi$12. Transistors Q2 in cells 1 through 1N are enabled during phases $\phi$23, if, and only if, the appropriate address signal is applied. Consequently, signal $V_{DD}$ is applied to cell 1 only during $\phi 2$ of the four phase clock signal (i.e. the time period when transistors Q1 and Q2 are mutually operative.)

The $\phi 12$ signal is also selectively supplied to the control electrode of transistor Q4 via transistor Q3. During phase $\phi 1$ of the clock signal, the output terminal of transistor Q4 is shorted to ground via transistor Q6. However, when the address signal ADD 15 is applied concurrent with the clock signal $\phi 23$, the output terminal of transistor Q4 is connected to source $V_{DD}$ via transistors Q4 and Q5. Thus, the output terminal of transistor Q4 is shorted to ground during $\phi 1$ but produces the signal $V_{DD}$ during phase $\phi 2$ so as to render FET $Q_{10}$ conductive and thereby clamp the KC2 line to ground via the conduction path thereof (provided the BTS and the ADD 15 signals are supplied).

If a binary one signal ($V_{DD}$) is produced at the output terminal of transistor Q4 (indicative of the application of the ADD 15 signal), transistor Q10 is rendered conductive. The conduction path of transistor Q10 is connected between the $\phi 34$ clock source and node 55 which represents the "Kill Cell 2" (KC2) line as well as the input to delay circuit 56. Because of the operation of transistors Q4 and Q10, a one-half bit time delay (i.e. corresponding to half the period of the four phase clock signal) occurs between the application of a signal to transistor Q4 and the generation of the KC2 signal. Delay circuit 56 may comprise a suitable type of delay circuit such as a pair of series connected NAND gates or the like to effectively insert a full bit time delay into the circuit. The output terminal of delay 56 is connected to the control electrode of transistor Q20. The conduction path of transistor Q20 is connected between the $\phi 34$ clock source and "Load Cell 2" (LD2) line. Thus, the LC2 signal is delayed by a full bit time after the generation of the KC2 signal. This operation permits the KC2 signal to be supplied to transistor Q16 of cell 2 (and similar transistors in cells 2A through 2N). The KC2 signal causes cell 2 to be "killed" or effectively cleared or driven to zero. One bit time later, the LD2 signal is supplied to the control electrode or transistor Q15 and similar transistors associated with cells 2A-2N. This signal permits the information at node A to be transferred to the appropriate cell 2. Similarly, the outputs of cells 1A-1N are transferred to 2A-2N through their associated AND gates.

In addition, the LD2 signal is applied to the input terminal of delay 57 which inserts an additional half-bit delay into the propagation of the LD2 signal to the control electrode of transistor Q21. The conduction path of transistor Q21 is connected between the $\phi 1$ cycle of the clock source and the KC1 signal line. Consequently, one-half bit time after information is loaded into cell 2 from cell 1, cell 1 is killed or cleared by the KC1 signal as well as the other cells 1A-1N. That is, transistor Q21 is rendered conductive and the $\phi 1$ phase clock signal is applied to KC1 line and, thus, to the control electrode of transistor Q11. As a result, transistor Q11 is rendered conductive and shorts node A to ground. Thus, cell 1 is cleared and made ready for further operations.

In addition, a suitable and conventional time-out gate 60 of any desirable configuration may be connected to the control electrode of transistor Q10. The function of time-out gate 60 is to clamp transistor Q10 in the conductive condition for a relatively short time at the commencement of circuit operations. The $\phi 34$ signal is supplied through transistor Q10 to node 55 so that the KC2 signal is generated thereby driving each of the cell 2 output terminals to zero. This prevents the output device, e.g. a printer, from receiving spurious information during the start up or initialization of the circuit operation.

Thus, there has been shown and decribed a circuit having a pair of buffers each of which comprises at least one memory cell. One of the memory cells is selectively and sequentially addressed by a control device such as a RAM. This memory cell selectively receives information from the control device. When each of the memory cells in one of the buffers has been sequenced and received the appropriate information from the control device, an addtional signal is produced by the control device which permits an interconnection between each cell in the first buffer and a corresponding cell in the second buffer. The control circuitry selectively clears each of the cells in the second buffer prior to loading information from the first buffer. Consequently, no spurious information is retained from prior operations. Likewise, when the cells in the second buffer are loaded, a signal is initiated to effectively clear each of the cells in the first buffer whereby sequential addressing thereof can take place again.

Having thus described a preferred embodiment of the instant invention, it is noted that those skilled in the art can contemplate additions or modifications to the instant circuit. For example, the phase relationship of the various signals may be modified in the event that a system other than a four-phase system of clocking is utilized. Moreover, a system using positive logic or negative logic can be provided. As a result, certain obvious modifications to the system would be required. However, so long as the change or modifications fall within the purview of the foregoing description, they are intended to be included therein. The scope of the invention is to be limited only by the claims appended hereto and suitable equivalents.

Having thus described presently preferred embodiment of the invention, what is claimed is:

1. In combination,
   first memory means for receiving and storing information therein,
   said first memory means comprising a plurality of memory cells, each of said memory cells having respective input and output means,
   second memory means for receiving and storing the information from said first memory means,
   said second memory means comprising a plurality of memory cells, each of said memory cells having respective input and output means, the respective output means of said memory cells comprising said first memory means connected to the respective input means of the memory cells comprising said second memory means,
   first control means connected to said first memory means to selectively address the plurality of memory cells comprising said first memory means to selectively enable each of said memory cells to receive information one at a time, said first control means generating a load-complete signal indicating that information entry into the memory cells comprising said first memory means is complete, and
   second control means connected to each of said first and second memory means and responsive to said load-complete signal of said first control means to control transferring the information that is stored in said first memory means to said second memory means and to control clearing said second memory means prior to permitting said information to be received by and stored in said second memory means.

2. The combination recited in claim 1 wherein each memory cell comprises, additional input means, output means for storing a desired data condition, recirculating means for periodically recirculating said condition of said output means back to said additional input means, boosting means connected between said additional input means and said output means for boosting said recirculated signal condition of said output means, whereby said boosting means and said recirculating means maintain said output means in said desired data condition.

3. The combination recited in claim 1 including interface means connected between said first memory means and said second memory means, and said second control means connected to said interface means to selectively enable said interface means and thereby permit information to be transferred to said second memory means via said interface means.

4. The combination recited in claim 3 wherein said first control means includes, signal producing means for selectively energizing said cells of said first memory means to permit information to be sequentially stored therein when said first memory means is addressed by said first control means, and said second control means includes, gate means connected to said second memory means for periodically supplying signals to effectively clear said second memory means, first delay means connected between said gate means and said interface means to delay enabling said interface means and the transferring of said information from said first memory means to said second memory means until said second memory means is cleared, and second delay means connected between said first delay means and said first memory means to delay clearing said first memory means until information is transferred into said second memory means from said first memory means.

5. In combination:

first memory means for receiving and storing information therein, said first memory means comprising a plurality of memory cells each having respective input and output means;

second memory means for receiving and storing information therein, said second memory means comprising a plurality of memory cells, each of said memory cells of said second memory means having respective input and output means;

first control means for generating sequential input control signals, said first control means connected to said respective input means of said memory cells comprising said first memory means to effect entry of said information therein, said first control means further providing a load-complete signal indicating that information entry into said first memory means is completed; and second control means responsive to said load-complete signal provided by said first control means to sequentially control: (a) clearing said second memory means, (b) transferring said information stored in said first memory means to said second memory means and (c) clearing said first memory means.

6. The combination recited in claim 5 wherein said second control means includes:

gate means connected to said second memory means for clearing said second memory means, said gate means being enabled by said load-complete signal;

first delay means connected to said gate means, said first delay means delaying the transfer of information from said first memory means to said second memory means until said second memory means is cleared of information; and second delay means connected between said first delay means and said first memory means to delay clearing said first memory means until the information of said first memory means is transferred to said second memory means.

7. The combination recited in claim 6, including:

interface gate means connected between the respective output means of said memory cells comprising said first memory means and the respective input means of the memory cells comprising said second memory means for transferring information between said first and second memory means, said first delay means being connected between said gate means comprising said second control means and said interface gate means to provide said interface gate means with a transfer enabling signal.

* * * * *